(12) United States Patent
Rha et al.

(10) Patent No.: US 9,997,400 B2
(45) Date of Patent: Jun. 12, 2018

(54) SEMICONDUCTOR DEVICE AND METHOD OF MANUFACTURING THE SAME

(71) Applicant: SAMSUNG ELECTRONICS CO., LTD., Suwon-si, Gyeonggi-do (KR)

(72) Inventors: Sangho Rha, Seongnam-si (KR); Kyoung Hee Nam, Seoul (KR); Jeonggil Lee, Hwaseong-si (KR); Hyunseok Lim, Suwon-si (KR); Seungjong Park, Seoul (KR); Seulgi Bae, Yeosu-si (KR); Jaejin Lee, Goyang-si (KR); Kwangtae Hwang, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days. days.

(21) Appl. No.: 15/332,297

(22) Filed: Oct. 24, 2016

(65) Prior Publication Data

US 2017/0170058 A1 Jun. 15, 2017

(30) Foreign Application Priority Data

Dec. 11, 2015 (KR) ........................ 10-2015-0177318

(51) Int. Cl.
*H01L 21/768* (2006.01)

(52) U.S. Cl.
CPC .... *H01L 21/76816* (2013.01); *H01L 21/7684* (2013.01); *H01L 21/76849* (2013.01); *H01L 21/76864* (2013.01); *H01L 21/76867* (2013.01)

(58) Field of Classification Search
CPC .......... H01L 21/76816; H01L 21/7684; H01L 21/76849

See application file for complete search history.

(56) References Cited

U.S. PATENT DOCUMENTS 6,265,779 B1 * 7/2001 Grill .................. H01L 21/3127
257/759
6,979,645 B2 12/2005 Horikoshi et al.
7,709,324 B2 5/2010 Shiratake
(Continued)

FOREIGN PATENT DOCUMENTS

KR 100567062 B1 3/2006
KR 100681203 B1 2/2007
KR 1020080013184 A 2/2008

*Primary Examiner* — Jay C Chang
*Assistant Examiner* — Mikka Liu
(74) *Attorney, Agent, or Firm* — Volentine, Whitt & Francos, PLLC

(57) ABSTRACT

A semiconductor device includes a substrate, a first metal interconnection provided on a first region of the substrate, and a second metal interconnection provided on a second region of the substrate. A width of the second metal interconnection is greater than a width of the first metal interconnection. The first metal interconnection includes a metal pattern. The second metal interconnection includes a lower metal pattern having a concave surface at its top, an upper metal pattern disposed on the concave surface at the top of the lower metal pattern, and a first barrier pattern interposed between the lower metal pattern and the upper metal pattern. The metal interconnections are formed by a damascene process including deposition, reflow, metal implantation, and planarization processes.

19 Claims, 8 Drawing Sheets

(56) References Cited

U.S. PATENT DOCUMENTS

| | | |
|---|---|---|
| 7,936,070 B2 | 5/2011 | Hayashi et al. |
| 8,492,897 B2 | 7/2013 | Cabral, Jr. et al. |
| 8,716,134 B2 * | 5/2014 | Edelstein et al. |
| 2009/0283913 A1* | 11/2009 | Hayashi ............ H01L 21/76846 257/762 |
| 2010/0065898 A1 | 3/2010 | Choi et al. |
| 2010/0327447 A1 | 12/2010 | Iguchi et al. |
| 2012/0153479 A1* | 6/2012 | Aubel ............... H01L 21/76847 257/751 |
| 2013/0230982 A1* | 9/2013 | Morita .............. H01L 21/32051 438/653 |

* cited by examiner

SEMICONDUCTOR DEVICE AND METHOD OF MANUFACTURING THE SAME

PRIORITY STATEMENT

This U.S. non-provisional patent application claims priority under 35 U.S.C. § 119 to Korean Patent Application No. 10-2015-0177318, filed on Dec. 11, 2015, in the Korean Intellectual Property Office, the disclosure of which is hereby incorporated by reference in its entirety.

BACKGROUND

The inventive concepts relate to a semiconductor device and to a method of manufacturing the same and, more particularly, to conductive traces or wiring of a semiconductor device that provide interconnections in the device and to a method of manufacturing the same.

Semiconductor devices are widely used in the electronics industry because of their small sizes, multi-functional characteristics, and low manufacturing costs. Semiconductor devices may be categorized as any one of semiconductor memory devices storing logical data, semiconductor logic devices processing logic data, and hybrid semiconductor devices having both the function of semiconductor memory devices and the function of semiconductor logic devices.

High-speed and low-voltage semiconductor devices are in demand to satisfy desired performance characteristics (e.g., high speed and/or low power consumption) of various electronic products. Semiconductor devices have been highly integrated to meet these demands. In particular, the critical dimension (CD) of fine patterns of metal wiring that form electrical interconnections of electronic components of semiconductor devices has become smaller. However, the reliability of semiconductor devices may be compromised by increases in the integration density of semiconductor device. Thus, research has been conducted into new techniques capable of increasing the integration density of semiconductor devices while maintaining a high degree of reliability of the devices.

SUMMARY

According to an aspect of the inventive concepts, there is provided a semiconductor device including a substrate, a first metal interconnection disposed on a first region of the substrate, and a second metal interconnection disposed on a second region of the substrate, the second metal interconnection having a width greater than a width of the first metal interconnection, and in which the first metal interconnection comprises a metal pattern, and the second metal interconnection comprises a lower metal pattern having a top surface at least a portion of which is concave, an upper metal pattern disposed on the concave portion of the top surface of the lower metal pattern, and a first barrier pattern interposed between the lower metal pattern and the upper metal pattern.

According to another aspect of the inventive concepts, there is provided a method of manufacturing a semiconductor device including forming a first insulating layer on a substrate, patterning the first insulating layer to form a first trench and a second trench that is wider than the first trench, forming a lower metal layer filling a portion of each of the first and second trenches, the lower metal layer extending along inner surfaces defining a bottom and sides of each of the first and second trenches, implanting ions of a barrier metal into a top portion of the lower metal layer to form a barrier layer which extends into each of the first and second trenches, and performing a planarization process to planarize the barrier layer, the lower metal layer, and the first insulating layer to such an extent that the barrier layer is removed from the first trench, and in which a portion of the barrier layer remains in the second trench, after the planarization process, as a first barrier pattern covering at least a portion of a top surface of the lower metal layer in the second trench.

According to another aspect of the inventive concepts, there is provided a method of manufacturing a semiconductor device including forming an insulating layer on a substrate, forming a first trench extending longitudinally in the insulating layer, forming a second trench extending longitudinally in the insulating layer as spaced laterally from the first trench and wherein the second trench has a cross-sectional area in a direction of its width that is greater than that of the first trench, forming a first lower metal pattern having a substantially planar top surface within the first trench, and forming a second lower metal pattern topped by a barrier pattern within the second trench, and wherein the first and second lower metal patterns are formed of the same material comprising a first metal, the second lower metal pattern is formed such that at least a portion of its top is concave within the second trench, a point along the concave portion closest to the substrate being situated at a level beneath the level of the level of the substantially planar top surface of the first lower metal pattern, and the barrier pattern extends along the concave portion so as to have a generally U-shaped cross section, and is formed of the first metal and a second metal different in kind from the first metal According to another aspect of the inventive concepts, there is provided a method of manufacturing a semiconductor device including forming an insulating layer on a substrate, forming a series of similar first trenches in the insulating layer over a first region of the substrate wherein the first trenches are disposed side-by-side in a first direction and each of the first trenches has substantially the same depth, forming at least one second trench in the insulating layer over a second region of the substrate outside the first region and to substantially the same depth as each of the first trenches and wherein an average width of each second trench is greater than an average width of each of the first trenches in the first direction, forming a lower metal layer extending within each of the trenches wherein the lower metal layer has concavities in its upper portion, the concavities are vertically aligned with the first and second trenches, respectively, and each concavity aligned with the second trench extends into the second trench, forming a barrier layer conformally along the upper portion of lower metal layer, planarizing the barrier layer and the lower metal layer to such extents that a portion of the lower metal layer remains as first and second lower metal patterns within the first and second trenches, respectively, and the barrier layer is removed from over the first region of the substrate while a portion of the barrier layer remains as a respective barrier layer pattern on the second lower metal pattern in the second trench, and forming an upper metal pattern on the first barrier layer pattern within each said at least one second trench.

BRIEF DESCRIPTION OF THE DRAWINGS

The inventive concepts will become better understood from the detailed description of examples thereof that follows with reference to the accompanying drawings.

DETAILED DESCRIPTION

Figure 1:
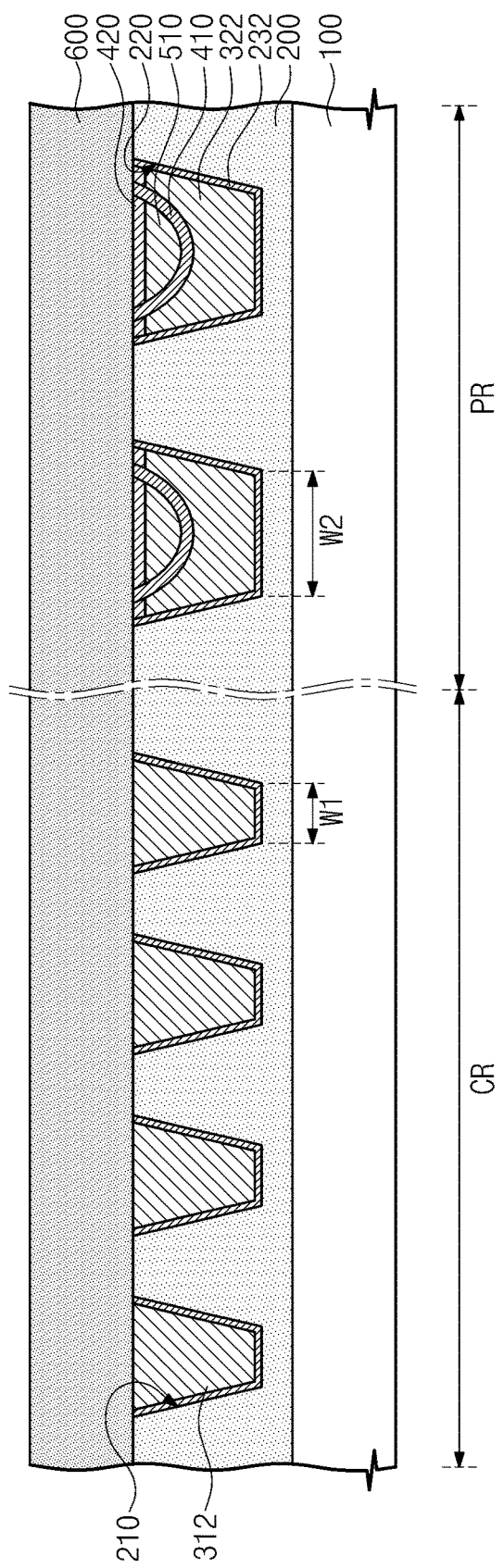
FIG. 1 is a cross-sectional view illustrating a semiconductor device according to some examples of the inventive concepts.

The inventive concepts will now be described more fully hereinafter with reference to the accompanying drawings, in which examples of the inventive concepts are shown. The inventive concept may, however, be embodied in different forms and should not be constructed as limited to the examples set forth herein. Rather, these examples are provided so that this disclosure will be thorough and complete, and will fully convey the scope of the inventive concept to those skilled in the art. The same reference numerals or the same reference designators denote the same elements throughout the drawings.

FIG. 1 is a cross-sectional view illustrating a semiconductor device according to some examples of the inventive concepts.

Referring to FIG. 1, the semiconductor device includes a substrate 100. The substrate 100 may be a semiconductor substrate. For example, the substrate 100 may be a silicon (Si) substrate, a germanium (Ge) substrate, or a silicon-germanium (SiGe) substrate. The semiconductor device or substrate 100 may include a cell region CR in or on which memory cells are formed, and a peripheral circuit region (or a peripheral region) PR in or on which peripheral circuits controlling the memory cells are formed. In some examples, each of the memory cells includes a transistor having a floating gate. A first insulating layer 200 may be provided on the substrate 100. For example, the first insulating layer 200 may comprise a silicon oxide layer. The first insulating layer 200 may cover the cell region CR and the peripheral circuit region PR of the substrate 100.

A first trench 210 and a second trench 220 may be provided in the first insulating layer 200. The first trench 210 may be provided in the first insulating layer 200 disposed on the cell region CR, and the second trench 220 may be provided in the first insulating layer 200 disposed on the peripheral circuit region PR. In some examples, the first trench 210 is provided in multiples in the first insulating layer 200 of the cell region CR. In some examples, the second trench 220 is provided in multiples in the first insulating layer 200 of the peripheral circuit region PR. Each of the first and second trenches 210 and 220 may extend longitudinally along a direction parallel to a top surface of the substrate 100. The first trench 210 and the second trench 220 may have respective widths W1 and W2, referred to hereinafter for ease of description as first width W1 and second width W2. The first width W1 may be a width of a bottom of the first trench 210 in a direction that is parallel to the top surface of the substrate 100 and is perpendicular to the longitudinal direction of the first trench 210. The second width W2 may be a width of a bottom of the second trench 220 in a direction that is parallel to the top surface of the substrate 100 and is perpendicular to the longitudinal direction of the second trench 220. The second width W2 may be greater than the first width W1. Also, the first and second trenches 210 and 220 may be formed to the same depths. Thus, the second trench 220 may have a cross-sectional area, in the direction of its width, which is greater than that of each first trench 210.

A diffusion barrier pattern 232 may be provided in each of the first and second trenches 210 and 220 to partially fill each of the first and second trenches 210 and 220. The diffusion barrier patterns 232 may conformally cover inner surfaces of the insulating layer 200 defining the first and second trenches 210 and 220. The diffusion barrier patterns 232 may prevent metal atoms of lower metal patterns 312 and 322 to be described below from diffusing into the first insulating layer 200. The diffusion barrier patterns 232 may comprise at least one material selected from the group consisting of tantalum (Ta), tantalum nitride (TaN), and tantalum-silicon nitride (TaSiN).

A first lower metal pattern 312 may be provided in each first trench 210. The first lower metal pattern 312 may fill what remains of the first trench 210 after the diffusion barrier patterns 232 are formed. The first lower metal pattern 312 comprises copper (Cu), for example. The first lower metal pattern 312 may be electrically connected to an element (e.g., the memory cell) formed on the substrate 100 of the cell region CR. In some examples, the first lower metal pattern 312 may be a metal interconnection for supplying power to the memory cell of the cell region CR.

A second lower metal pattern 322 may be provided in each second trench 220 to fill what remains of the second trench 220 after the diffusion barrier patterns 232 are formed. The second lower metal pattern 322 may cover the bottom surface and inner side surfaces that define the bottom and sides of the second trench 220, respectively. At least a portion of the top of the second lower metal pattern 322 may be concave. In other words, at least a portion of the top surface of the second lower metal pattern 322 may have a U-shaped cross section (more specifically, a U-shape in a vertical plane extending in the widthwise-direction of the second trench 220). The term "surface" of an element as used herein may refer to a boundary between that element in its final form and another element or layer in contact therewith, as will become clear in the description that follow. The second lower metal pattern 322 may comprise copper (Cu), for example.

A first barrier pattern 410 may be provided on the second lower metal pattern 322 to conformally cover the concave top surface of the second lower metal pattern 322. In other words, the first barrier pattern 410 may extend along the concave top surface of the second lower metal pattern 322 so as to also have a U-shaped when cross section (a U-shape in the vertical plane extending in the widthwise direction of the second trench 220). The first barrier pattern 410 may be provided in the second trench 220. The first barrier pattern 410 may be formed by injecting a barrier metal into the top of the second lower metal pattern 322 (e.g., a copper (Cu) pattern). In some examples, the barrier metal injected into the second lower metal pattern 322 is manganese (Mn). An upper metal pattern 510 may be provided on the first barrier pattern 410. The upper metal pattern 510 may be provided in the second trench 220. The first barrier pattern 410 may be interposed between the upper metal pattern 510 and the second lower metal pattern 322. A bottom surface of the upper metal pattern 510 may be in contact with a top surface of the first barrier pattern 410. Thus, the bottom surface of the upper metal pattern 510 may have a U-shaped cross section. A top surface of the upper metal pattern 510 may be coplanar with a portion of the top surface of the second lower metal pattern 322. In some examples, the upper metal pattern 510 is of the same material as the second lower metal pattern 322. For example, the upper metal pattern 510 may comprise copper (Cu).

A second barrier pattern 420 may be provided on the upper metal pattern 510. The second barrier pattern 420 may be provided in the second trench 220. The second barrier pattern 420 may cover the top surface of the upper metal pattern 510 and may extend onto (an outer peripheral portion of) the top surface of the second lower metal pattern 322 which is coplanar with the top surface of the upper metal pattern 510. In some examples, the second barrier pattern 420 is formed by providing a barrier metal in that portion of the top surface of the second lower metal pattern 322 which does not cover the first barrier pattern 410, and the top surface of the upper metal pattern 510. The barrier metal of the second barrier pattern 420 may be the same material as the barrier metal of the first barrier pattern 410. For example, the barrier metals of the first and second barrier patterns 410 and 420 may be manganese (Mn). A concentration of the barrier metal of the first barrier pattern 410 may be higher than that of the barrier metal of the second barrier pattern 420. The first and second barrier patterns 410 and 420 may prevent electro-migration of metal atoms (e.g., copper atoms) in the second lower metal pattern 322 and the upper metal pattern 510. As a result, the first and second barrier patterns 410 and 420 may prevent the contact (or the electrical short) between metal interconnections adjacent to each other on the peripheral circuit region PR, and thus reliability of the semiconductor device may be improved or increased.

The second lower metal pattern 322 may be electrically connected to a component(s), e.g., the peripheral circuit, formed on the peripheral circuit region PR of the substrate 100. The second lower metal pattern 322, the upper metal pattern 510, and the first and second barrier patterns 410 and 420 may constitute a metal interconnection for supplying power to the component(s), e.g., the peripheral circuit, of the peripheral circuit region PR. A second insulating layer 600 may be provided on the first insulating layer 200 and metal patterns 312, 322, and 510. The second insulating layer 600 may comprise a silicon nitride layer.

FIGS. 2 to 8 illustrate some examples of a method of manufacturing a semiconductor device according to the inventive concepts.

Figure 2:
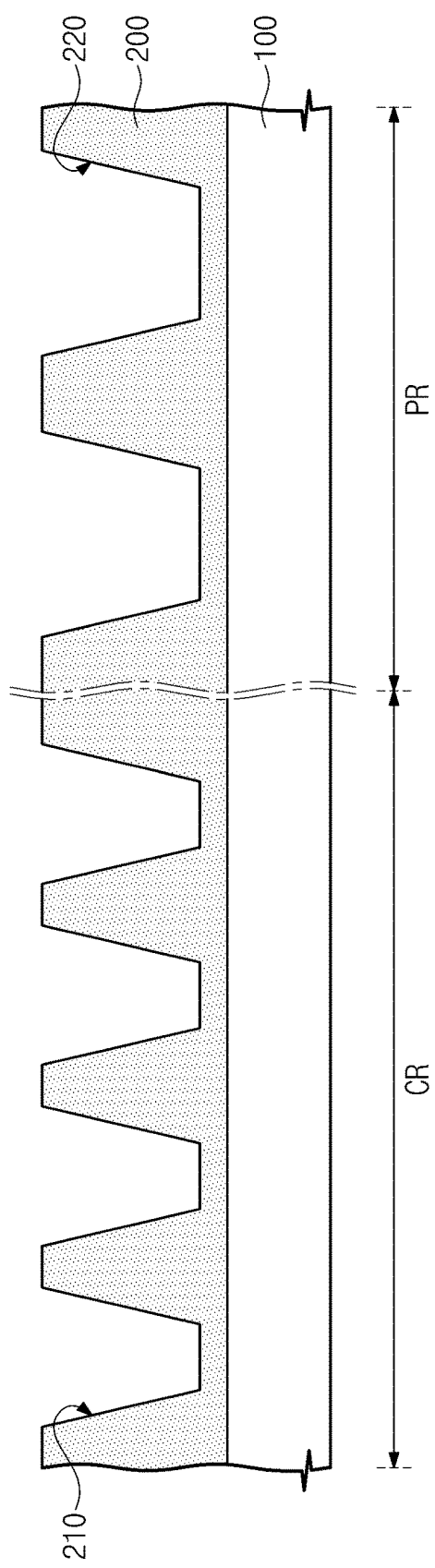
FIGS. 2, 3, 4, 5, 6, 7 and 8 are cross-sectional views of a semiconductor device during the course of its manufacture and together illustrate some examples of a method of manufacturing a semiconductor device according to the inventive concepts.

Referring to FIG. 2, a first insulating layer 200 may be formed on a substrate 100. For example, the substrate 100 may be a silicon (Si) substrate, a germanium (Ge) substrate, or a silicon-germanium (SiGe) substrate. The substrate 100 may include a cell region CR and a peripheral circuit region PR. The first insulating layer 200 may be formed to cover the cell region CR and the peripheral circuit region PR. For example, the first insulating layer 200 may comprise a silicon oxide layer. The first insulating layer 200 may be formed on the substrate 100 by a chemical vapor deposition (CVD) process, a physical vapor deposition (PVD) process, or an atomic layer deposition (ALD) process. The first insulating layer 200 may be patterned to form a first trench 210 and a second trench 220. The first insulating layer 200 of the cell region CR may be patterned to form the first trench 210, and the first insulating layer 200 of the peripheral circuit region PR may be patterned to form the second trench 220. Each of the first and second trenches 210 and 220 may extend longitudinally in a direction parallel to a top surface of the substrate 100. A width of the second trench 220 may be greater than that of the first trench 210. Here, there term "width" may refer to an average width as taken over the depths of the trenches or a width as both taken in a common horizontal plane, e.g., as both taken along the bottoms of the trenches. The cross-sectional area of the second trench 220, in the direction of its width, may be greater than that of the first trench 210.

Figure 3:
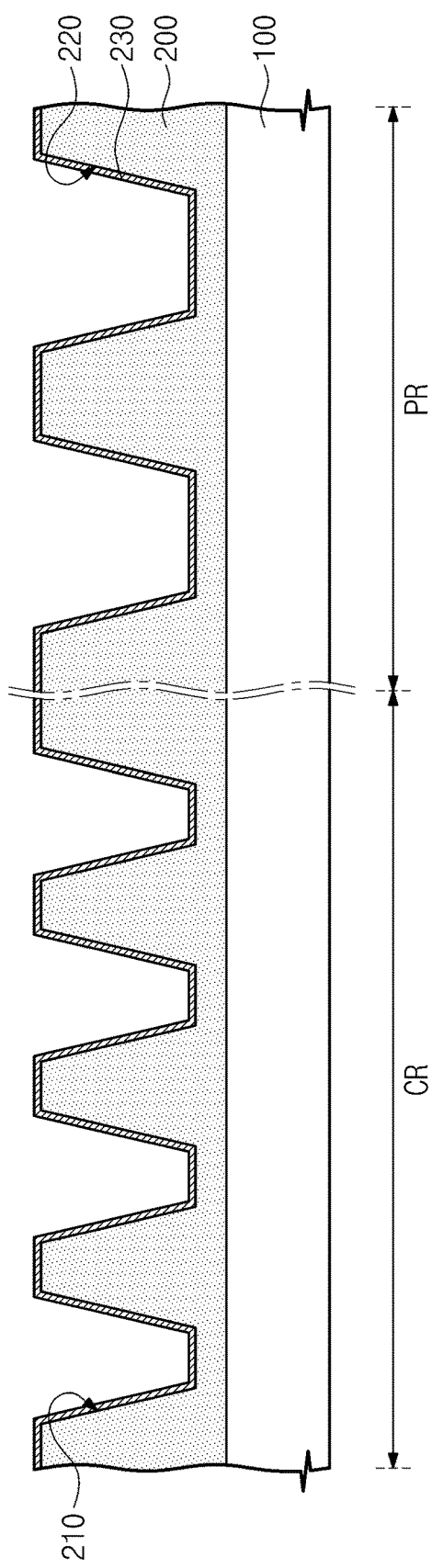

Referring to FIG. 3, a diffusion barrier layer 230 may be formed to conformally cover a top surface of the first insulating layer 200 and inner surfaces of the first insulating layer 200 which delimit the first and second trenches 210 and 220. For example, the diffusion barrier layer 230 may include at least one material selected from the group consisting of tantalum (Ta), tantalum nitride (TaN), and tantalum-silicon nitride (TaSiN). The diffusion barrier layer 230 may be formed by a CVD process, a PVD process, or an ALD process.

Figure 4:
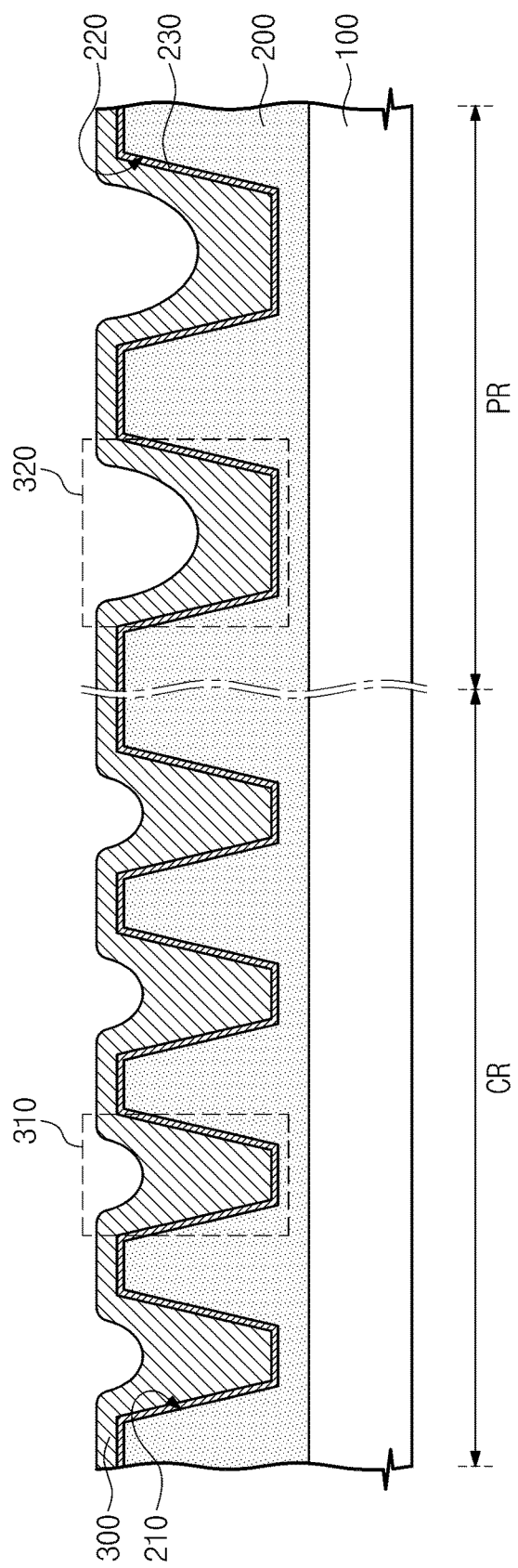

Referring to FIG. 4, a lower metal layer 300 may be formed on the diffusion barrier layer 230. The lower metal layer 300 may include a first portion 310 filling a portion of the first trench 210 and a second portion 320 filling a portion of the second trench 220. Each of the first and second portions 310 and 320 may have a concave top surface. In some examples, the lower metal layer 300 is formed of copper (Cu). However, the use of the word "metal" in the term "metal layer", for instance, does imply that the layer consists of a single metal such as copper (Cu). Rather, the term "metal" may be used to describe a conductive layer or pattern that consists essentially of a particular metal and may have some relatively small amounts of other elements.

Forming the lower metal layer 300 may include forming a preliminary lower metal layer and performing a reflow process on the preliminary lower metal layer. The preliminary lower metal layer may cover the first insulating layer 200 and may fill a portion of each of the first and second trenches 210 and 220. The preliminary lower metal layer may be formed by a CVD process, a PVD process, or an ALD process. The preliminary lower metal layer may be melted during the reflow process of the preliminary lower metal layer. Thus, the lowest part of the top surface of the lower metal layer 300 disposed in the second trench 220 may be situated at a level lower than that at which the lowest part of the top surface of the lower metal layer 300 disposed in the first trench 210 is situated. The melted preliminary lower metal layer may be hardened to form the lower metal layer 300.

At this time, the lower metal layer 300 may have concavities in its upper portion, and which concavities are vertically aligned with the first and second trenches 210 and 220, respectively. In particular, a significant concavity forms in the upper portion of the lower metal layer 300 in vertical alignment with the second trench 220 because of the relatively large dimensions of the second trench, whereas a small concavity may form in the upper portion of the lower metal layer 300 as vertically aligned with the first trench 210. The concavity formed in the upper portion of the lower metal layer 300 as aligned with the second trench 220 extends into the second trench 220.

Figure 5:
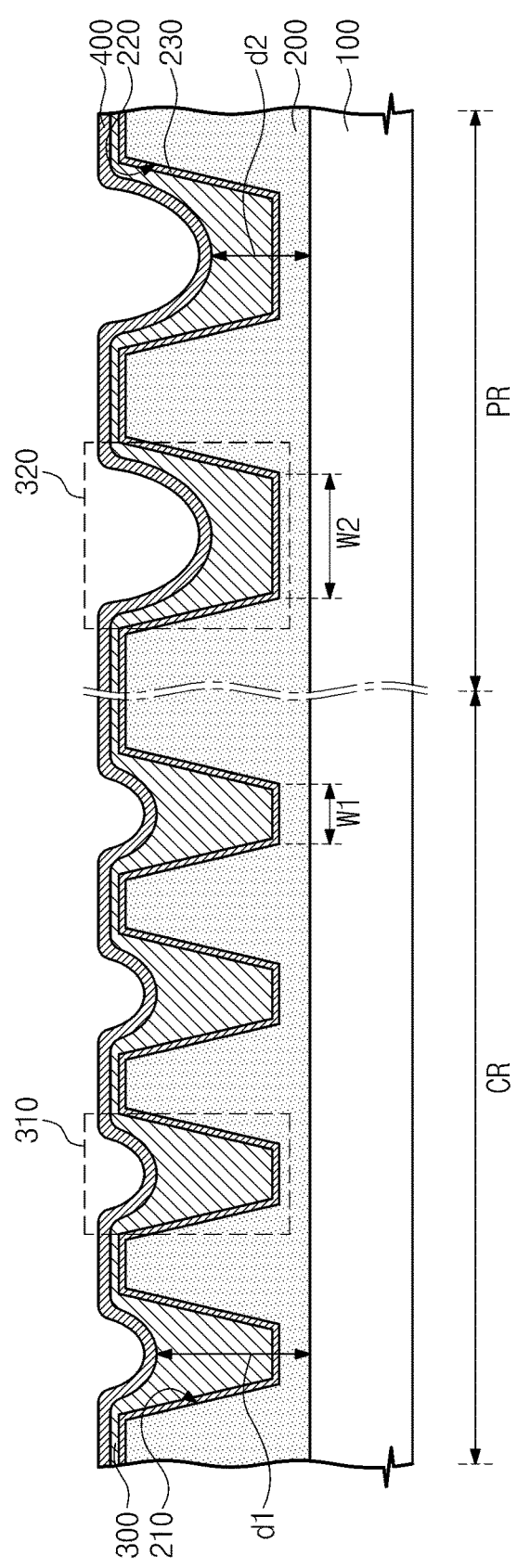

Referring to FIG. 5, a barrier layer 400 may be formed to conformally cover the top surface of the lower metal layer 300. The barrier layer 400 may fill a remaining part of each of the trenches 210 and 220. In some examples, a barrier metal is implanted into the lower metal layer 300 by an ion implantation process, thereby forming the barrier layer 400. In some examples, the barrier layer 400 is formed by implanting manganese (Mn) into a top portion of the lower metal layer 300. The barrier layer 400 disposed in each of the first and second trenches 210 and 220 may be rounded toward the bottom of each of the first and second trenches 210 and 220. In other words, the barrier layer 400 may extend along the concave top surfaces of the first and second portions 310 and 320 of the lower metal layer 300. In addition, the barrier layer 400 may have concave top surfaces on the first and second portions 310 and 320 of the lower metal layer 300. A width W2 of the bottom of the second trench 220 may be greater than a width W1 of the bottom of the first trench 210. Thus, the lowest point along the top surface of the lower metal layer 300 disposed in the second trench 220 may be situated at a lower level than the lowest point of the top surface of the lower metal layer 300 disposed in the first trench 210. The lowest portion of the barrier layer 400 in the first trench 210 may be spaced apart from the top surface of the substrate 100 by a distance d1. The lowest portion of the barrier layer 400 in the second trench 220 may be spaced apart from the top surface of the substrate 100 by a distance d2 smaller than the distance d1.

Figure 6:
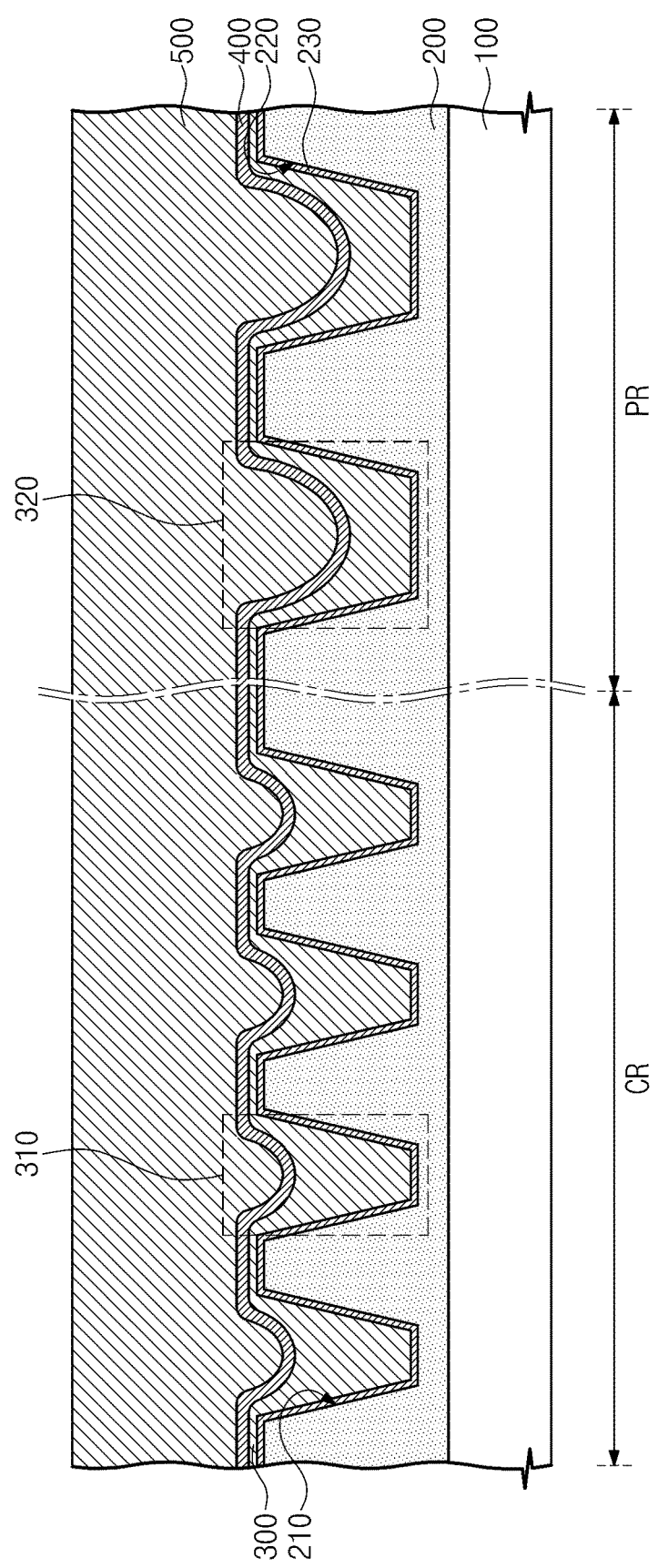

Referring to FIG. 6, an upper metal layer 500 may be formed on the barrier layer 400. In some examples, the upper metal layer 500 is formed of copper (Cu). In some examples, the upper metal layer 500 is formed by an electroplating process using the lower metal layer 300 and the barrier layer 400 as a seed. The upper metal layer 500 may fill the rest of the first trench 210 and the rest of the second trench 220. A distance from the top surface of the substrate 100 to the lowest portion of a bottom surface of the upper metal layer 500 in the first trench 210 may be greater than a distance from the top surface of the substrate 100 to the lowest portion of a bottom surface of the upper metal layer 500 in the second trench 220. In other words, the height of the lowest portion of the bottom surface of the upper metal layer 500 in the second trench 220 may be smaller than the height of the lowest portion of the bottom surface of the upper metal layer 500 in the first trench 210 relative to a reference surface such as the top surface of the substrate 100.

Figure 7:
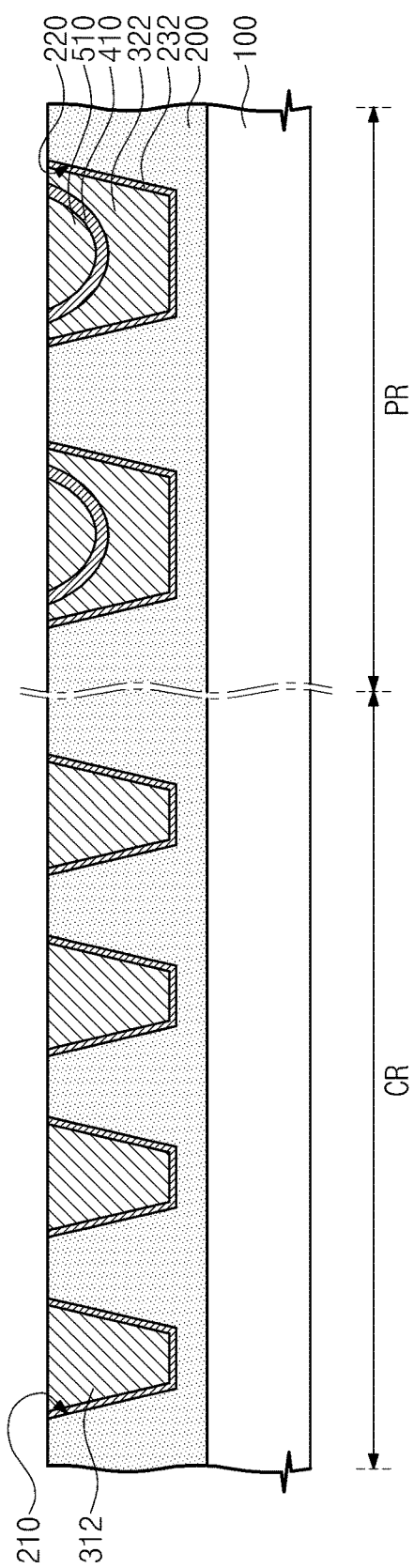

Referring to FIG. 7, the upper metal layer 500, the barrier layer 400, the lower metal layer 300, the diffusion barrier layer 230, and the first insulating layer 200 may be planarized until the barrier layer 400 disposed in the first trench 210 is removed. After the planarization process, none of the upper metal layer 500 and the barrier layer 400 may remain in the first trench 210 whereas residual portions of the upper metal layer 500 and the barrier layer 400 may remain in the second trench 220. Thus, a diffusion barrier pattern 232 and a first lower metal pattern 312 may fill the first trench 210. In addition, the residual portion of the upper metal layer 500, the residual portion of the barrier layer 400, the second portion 320 of the lower metal layer 300, and a residual portion of the diffusion barrier layer 230, which are disposed in the second trench 220, may constitute an upper metal pattern 510, a first barrier pattern 410, a second lower metal pattern 322, and a diffusion barrier pattern 232, respectively. Due to the planarization process, a top surface of the upper metal pattern 510 may be coplanar with a portion of a top surface of the second lower metal pattern 322 in the second trench 220. A concavity may remain in the top of the second lower metal pattern 322, i.e., at least a portion of the top surface of the second lower metal pattern 322 may be concave. In some examples, the second lower metal pattern 322 is formed so that it has a concavity in a central portion of its top, and an outer peripheral portion of the top surface of the second lower metal pattern 322, which extends to the sides of the concavity, may be coplanar with the top surface of the upper metal pattern 510. The first barrier pattern 410 may extend along the concave top surface of second lower metal pattern 322 as interposed between the upper metal pattern 510 and the second lower metal pattern 322.

Figure 8:
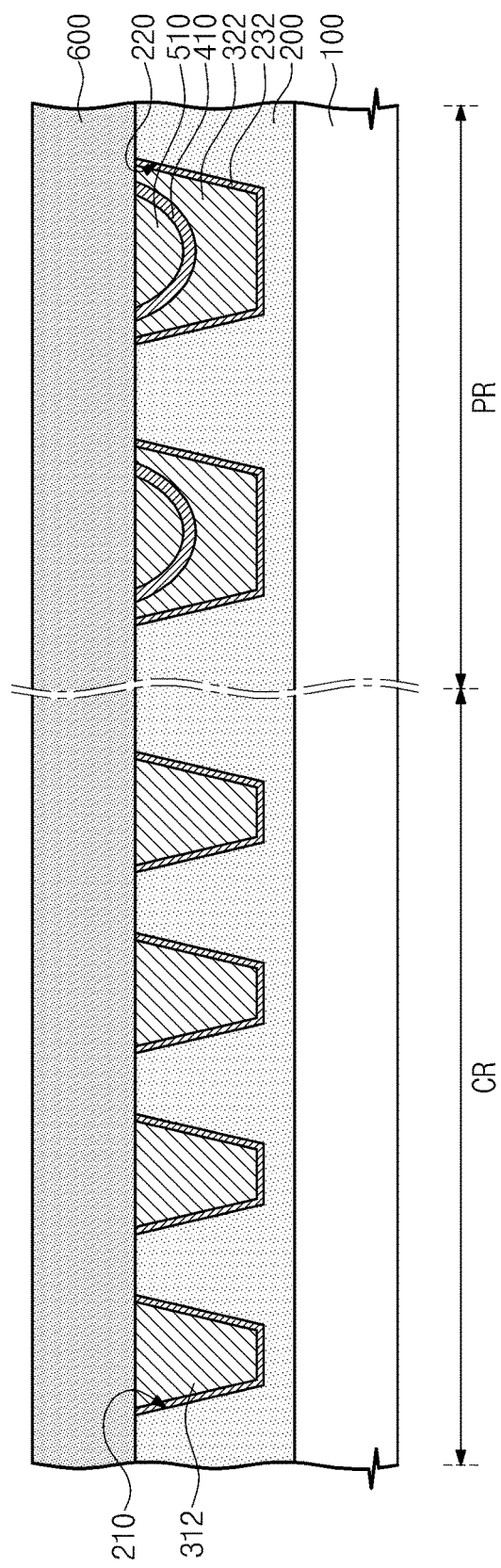

Referring to FIG. 8, a second insulating layer 600 may be formed on the first insulating layer 200 and the metal patterns 312, 322, and 510. For example, the second insulating layer 600 comprises a silicon nitride layer. The second insulating layer 600 may be formed by a CVD process, a PVD process, or an ALD process.

Referring again to FIG. 1, the substrate 100 may be thermally treated to form a second barrier pattern 420. The thermal treatment is carried out to heat the substrate 100 in a temperature that may range from about 100 degrees Celsius to about 450 degrees Celsius. A portion of the barrier metal of the first barrier pattern 410 may segregate and diffuse to a portion of the top surface of the second lower metal pattern 322 and the top surface of the upper metal pattern 510, and thus the second barrier pattern 420 may be formed. In some examples, the second barrier pattern 420 may correspond to an upper or top portion of the second lower metal pattern 322 and an upper or top portion of the upper metal pattern 510, and include manganese (Mn). A concentration of the barrier metal of the second barrier pattern 420 may be lower than that of the barrier metal of the first barrier pattern 410. The first and second barrier patterns 410 and 420 may prevent electro-migration of metal atoms of the second lower metal pattern 322 and the upper metal pattern 510. Thus, an electrical short between adjacent metal interconnections of the peripheral circuit region PR may be prevented to improve the reliability of the semiconductor device.

According to some examples of the inventive concepts, the metal interconnection of the cell region CR may have a low resistance, and the electrical short between the metal interconnections of the peripheral circuit region may be prevented.

According to some examples of the inventive concepts, electrical movement (i.e., the electro-migration) of the metal atoms in the metal interconnection may be prevented to improve or increase the reliability of the semiconductor device.

According to some examples of the inventive concepts, the metal interconnection electrically connected to an element of the cell region may have a low resistance.

The metal interconnection and the method of manufacturing the same according to the inventive concepts may be applied to any semiconductor device having a fine pattern of metal lines and more specifically to a flash memory device. For example, the technical features according to the inventive concepts may be applied to a dynamic random access memory (DRAM) device and/or a logic device.

Finally, examples of the inventive concepts have been described above in detail with respect to various examples thereof. The inventive concept may, however, be put into practice in many different ways and should not be construed as being limited to the examples described above. Rather, these examples were described so that this disclosure is thorough and complete, and fully conveys the inventive concept to those skilled in the art. Thus, the true spirit and scope of the inventive concept is not limited by the examples described above but by the claims that follow.

What is claimed is:
1. A method of manufacturing a semiconductor device, the method comprising:
   forming a first insulating layer on a substrate;
   patterning the first insulating layer to form a first trench and a second trench that is wider than the first trench;
   forming a lower metal layer filling a portion of each of the first and second trenches, the lower metal layer extend- ing along inner surfaces defining a bottom and sides of each of the first and second trenches;

implanting ions of a barrier metal into a top portion of the lower metal layer to form a barrier layer which extends into each of the first and second trenches; and performing a planarization process to planarize the barrier layer, the lower metal layer, and the first insulating layer to such extents that the barrier layer is removed from the first trench, wherein a portion of the barrier layer remains in the second trench, after the planarization process, as a first barrier pattern covering at least a portion of the lower metal layer in the second trench.

2. The method of claim 1, further comprising:

forming an upper metal layer filling a remainder of each of the first and second trenches after the barrier layer has been formed and before the planarization process; and performing a thermal treatment process on the substrate, after the planarization process, to form a second barrier pattern in the second trench, wherein part of the upper metal layer remains locally in the second trench as an upper metal pattern as a result of the planarization process, the top of the upper metal layer is made coplanar with a portion of the top of the lower metal layer in the second trench by the planarization process, and the second barrier pattern covers the upper metal layer and the portion of the top of the lower metal layer coplanar with the top of the upper metal layer.

3. The method of claim 2, wherein the first and second barrier patterns are formed to include both the barrier metal and a first metal of which is different in kind from the barrier metal, and such that a concentration of the barrier metal in the first barrier pattern is higher than a concentration of the barrier metal in the second barrier pattern.

4. The method of claim 2, further comprising:

forming a second insulating layer on the first insulating layer after the planarization process and before the thermal treatment process, wherein the thermal treatment process is performed at a temperature in a range of 100 degrees Celsius to 450 degrees Celsius.

5. The method of claim 1, wherein the forming of the lower metal layer comprises:

forming a preliminary lower metal layer on the first insulating layer; and melting the preliminary lower metal layer to fill a portion of each of the first and second trenches with the melted preliminary lower metal layer.

6. The method of claim 1, wherein the barrier layer is formed so as to be rounded in each of the first and second trenches towards the bottom of the trench.

7. The method of claim 1, wherein the barrier metal is manganese (Mn).

8. A method of manufacturing a semiconductor device, the method comprising:

forming an insulating layer on a substrate;

forming a first trench extending longitudinally in the insulating layer, and forming a second trench extending longitudinally in the insulating layer as spaced laterally from the first trench, wherein the second trench has a cross-sectional area in a direction of its width that is greater than that of the first trench;

forming a first lower metal pattern having a substantially planar top surface within the first trench;

forming a second lower metal pattern within the second trench; and forming a first barrier pattern within the second trench, wherein the first and second lower metal patterns are formed of the same material comprising a first metal, and the forming of the first and second lower metal patterns comprises depositing said material in both the first and second trenches to form a preliminary layer of said material, and reflowing the preliminary layer to form a lower metal layer extending within the first and second trenches, the second lower metal pattern is formed such that at least a portion of its top surface is concave within the second trench, a point along the top surface of the second lower metal pattern being situated at a level beneath the level of all points along the substantially planar top surface of the first lower metal pattern, and the first barrier pattern is formed by a process comprising implanting ions of a second metal, different in kind from the first metal, into the lower metal layer such that first barrier pattern is formed of the first metal and the second metal, and such that the first barrier pattern extends along the concave portion of the top surface of the second lower metal pattern so as to have a generally U-shaped cross section.

9. The method of claim 8, wherein an upper portion of the lower metal layer has a concavity extending into the second trench, and the forming of the first and second lower metal patterns and the first barrier pattern further comprises:

forming a barrier layer at the upper portion of the lower metal layer including along the concavity extending into the second trench; and planarizing the barrier layer and planarizing the lower metal layer to such extents that the first lower metal pattern is formed from the lower metal layer within the first trench, the second lower metal pattern is formed from the lower metal layer within the second trench, and the first barrier pattern is formed from the barrier layer as confined within the second trench at the top of the second lower metal pattern.

10. The method of claim 8, further comprising forming an upper metal pattern within the second trench, wherein the upper metal pattern is disposed on the first barrier pattern.

11. The method of claim 10, further comprising forming a second barrier pattern along the top of the upper metal pattern in the second trench.

12. The method of claim 11, wherein the second lower metal pattern is formed such that the top surface thereof has a substantially flat portion on opposite sides of the concave portion, the first barrier pattern extends along the concave portion but not the substantially flat portion of the top surface of the second lower metal pattern, and the second barrier pattern is also formed along the substantially flat portion of the top surface of the second lower metal pattern.

13. A method of manufacturing a semiconductor device, the method comprising:

forming an insulating layer on a substrate;

forming a first trench that extends longitudinally in the insulating layer over a first region of the substrate;

forming a second trench that extends longitudinally in the insulating layer over a second region of the substrate, an average width of the second trench being greater than an average width of the first trench;

forming a lower metal layer extending within each of the trenches, wherein the lower metal layer comprises a first metal, and the lower metal layer has concavities in its upper portion, the concavities vertically aligned with the first and second trenches, respectively, the concavity aligned with the second trench extending into the second trench;

forming a barrier layer comprising a second metal, different in kind from the first metal, along the upper portion of the lower metal layer;

planarizing the barrier layer and the lower metal layer to such extents that a portion of the lower metal layer remains as a first lower metal pattern within the first trench and as a second lower metal pattern within the second trench, and the barrier layer is removed from over the first region of the substrate while a portion of the barrier layer remains as a first barrier pattern along the top of the second lower metal pattern in the second trench;

forming an upper metal pattern on the first barrier pattern within the second trench; and forming a second barrier pattern comprising the second metal in the second trench along a top portion of the upper metal pattern, wherein the second barrier pattern is formed by performing a thermal treatment to diffuse a portion of the first barrier pattern to the top of the upper metal pattern and thereby form the second barrier pattern.

14. The method of claim 13, wherein the forming of the lower metal layer comprises:

depositing material comprising the first metal in the first and second trenches to form a preliminary layer of the material; and reflowing the preliminary layer, and wherein the barrier layer also comprises the first metal.

15. The method of claim 13, wherein the forming of the upper metal pattern includes forming an upper metal layer on the barrier layer, and planarizing the upper metal layer, in planarization that includes the planarizing of the barrier layer and the lower metal layer, such that part of the upper metal layer remains locally in the second trench as the upper metal pattern.

16. The method of claim 15, wherein the thermal treatment is performed after the upper metal layer, the barrier layer and the lower metal layer have been planarized to diffuse the portion of the first barrier pattern to the top portion of the upper metal pattern and thereby form the second barrier pattern.

17. The method of claim 16, wherein a top surface of the upper metal pattern is made coplanar with a portion of a top surface of the second lower metal pattern in the second trench by the planarizing of the upper metal layer and the planarizing of the lower metal layer, and the second barrier pattern is formed along the top surface of the upper metal pattern and the portion of the top surface of the second lower metal pattern coplanar therewith.

18. The method of claim 17, wherein the insulating layer is a first insulating layer, and further comprising:

forming a second insulating layer on the first insulating layer before the thermal treatment is performed, wherein the thermal treatment is performed at a temperature in a range of 100 degrees Celsius to 450 degrees Celsius.

19. The method of claim 13, wherein the forming of the barrier layer comprises implanting ions of the second metal into a top portion of the lower metal layer such that the first barrier pattern formed from the barrier layer comprises the first metal and the second metal.

* * * * *